United States Patent [19]
Miller et al.

[11] Patent Number: 6,144,103
[45] Date of Patent: Nov. 7, 2000

[54] GRADED PB FOR C4 BUMP TECHNOLOGY

[75] Inventors: Roy Mark Miller, Austin, Tex.; Bernd Maile, Stuttgart, Germany; Don A. Tiffin; Tim Z. Hossain, both of Austin, Tex.

[73] Assignee: Advanced Micro Devices, Inc., Sunnyvale, Calif.

[21] Appl. No.: 09/370,698

[22] Filed: Aug. 9, 1999

Related U.S. Application Data

[62] Division of application No. 09/189,922, Nov. 12, 1998.

[51] Int. Cl.$^7$ .......................... H01L 23/48; H01L 23/52; H01L 29/40
[52] U.S. Cl. ...................... 257/781; 257/779; 257/772; 438/613
[58] Field of Search ..................... 257/781, 779, 257/780, 772, 782, 737, 786; 438/108, 613, 614, 615

[56] References Cited

U.S. PATENT DOCUMENTS

| | | |
|---|---|---|
| 4,770,698 | 9/1988 | Dunlop et al. .................. 75/77 |
| 5,250,848 | 10/1993 | Christie et al. ................. 257/778 |
| 5,329,423 | 7/1994 | Scholz ............................ 361/760 |
| 5,406,701 | 4/1995 | Pepe et al. ..................... 29/840 |
| 5,808,874 | 9/1998 | Smith . |
| 5,897,336 | 4/1999 | Brouillette et al. . |
| 5,965,945 | 10/1999 | Miller et al. . |
| 5,990,564 | 11/1999 | Degani et al. . |
| 6,043,429 | 3/2000 | Blish, II et al. . |

FOREIGN PATENT DOCUMENTS

| | | |
|---|---|---|
| 0 690 149 A1 | 1/1996 | European Pat. Off. . |
| 0 881 676 A2 | 12/1998 | European Pat. Off. . |

OTHER PUBLICATIONS

May, T. & Woods, M., "A New Physical Mechanism for Soft Errors in Dynamic Memories", Electron Devices Society and Reliability Group of the IEEE, New York, NY, 1978, pp. 33–40.

Joint Industry Standard, "Implementation of Flip Chip and Chip Scale Technology", IPC, Northbrook, IL, J–STD–012, Jan. 1996, pp. 1–105.

*Primary Examiner*—Sheila V. Clark
*Attorney, Agent, or Firm*—Zagorin, O'Brien & Graham, LLP

[57] ABSTRACT

An improved solder bump composition and method advantageously employs a thin low-alpha layer of lead (Pb) deposited in close proximity to alpha particle sensitive devices, while ordinary (i.e., low cost) Pb is used for the bulk of the solder bump. This approach allows for reduced overall cost while still providing protection from alpha-particle induced soft errors. The low-alpha layer reduces the flux of alpha particle into devices in two ways. First, the low-alpha layer is itself essentially $Pb^{210}$ free and therefore alpha particle emissions from the low-alpha layer are negligible. Second, the low-alpha layer is substantially opaque to alpha particles emitted by the ordinary Pb which includes $Pb^{210}$. As a result, sensitive circuits on a semiconductor chip employing the improved solder bump are shielded from alpha particle emissions of the low-cost $Pb^{210}$-containing portion of a solder bump.

42 Claims, 6 Drawing Sheets

GRADED PB FOR C4 BUMP TECHNOLOGY

This application is a Divisional of co-pending application Ser. No. 09/189,922, filed Nov. 12, 1998, the entirety of which in incorporated herein by reference.

BACKGROUND OF THE INVENTION

1. Field of the Invention

The present invention relates to semiconductor packaging technology, and more particularly to flip chip and related chip scale semiconductor packaging technology.

2. Description of the Related Art

As electronic devices become smaller and more dense, greater demands are placed on the ability to establish efficient, reliable interconnections from a semiconductor chip to a substrate. There are at least three known methods for interconnecting chips to substrates. Those three methods are face-up wire bonding, face-up tape-automated bonding, and the flip chip method. Of these three methods, the flip chip method has often been chosen as a preferred method for semiconductor packaging, for it allows for the interconnection of high-density devices having a large number of input and output paths. Specifically, the flip chip method is preferred because it provides short conductive leads from the chip to the substrate, a small device footprint, low inductance, high frequency capabilities, and good noise control.

A flip chip is a semiconductor chip that is mounted onto a substrate with the surface of the chip facing the substrate. Although several materials may be used to form an interconnection between the flip chip and the substrate, solder is one of the more commonly employed materials. In the solder interconnect process termed controlled-collapse chip connection (C4), a solder bump is deposited on a wettable conductive terminal on the semiconductor chip. The semiconductor chip is then aligned with the substrate so that the solder bumps is directly over a solder wettable terminal of the substrate. The solder bump is then tacked to the substrate and reflowed, creating an electrical and mechanical connection from the chip to the substrate as well as a path for heat dissipation.

The C4 process typically uses lead-based alloy as solder. For example, lead-tin alloys having a composition of three to five weight percent of tin have been commonly used. Although the use of such lead-based alloys allows for desirable processing conditions and reliable interconnect structures, the composition of the solder indirectly causes errors in devices on the semiconductor chip which are sensitive to radiation.

Most lead which is used to form C4 solder contains a $Pb^{210}$ isotope which is a decay product of uranium. $Pb^{210}$ is a radiogenic isotope which has a half-life of twenty-two years and which eventually emits alpha particles with an energy of approximately 5.5 million electron volts (5.5 MeV). The emission of such alpha particles from the lead solder bump leads to errors in radiation-sensitive devices present on a semiconductor chip bonded to the solder bump.

Incident ionizing radiation of an alpha particle that impinges upon a semiconductor chip produces a trajectory of electron-hole pairs within the semiconductor chip. The charge resulting from those electron-hole pairs, in turn, may collect in a potential well of a device on the semiconductor chip. For example, charge may collect in an empty storage capacitor of a memory device. If the amount of charge so collected exceeds a critical upset charge value, the storage device registers as being full rather than empty. Hence, an alpha particle may cause a single nonrecurring read error on a single bit of a memory array. In other words, an alpha particle emitted from a solder bump is a potential source of soft errors.

It is apparent from the preceding discussion that eliminating all alpha particle emitting isotopes in lead such as $Pb^{210}$ would correspondingly lead to a reduction in radiation-induced soft errors in active devices. Although perhaps the most direct solution to the problem, completely eliminating radioactive isotopes in solder bumps has proven to be both difficult and very expensive. For instance, it is extremely difficult and costly to separate $Pb^{210}$ from bulk lead. Lead isotope separation necessitates the use of large, expensive instrumentation such as an accelerator. Furthermore, because of its limited supply, it is very costly to use lead which naturally has a low abundance of the $Pb^{210}$ isotope. In fact, such "low-alpha" lead typically costs between fifty and sixty times the cost of lead normally used to form solder bumps. Correspondingly, a need exists for a relatively inexpensive technique to reduce alpha particle emissions of lead-containing solder bumps.

Besides addressing the problem of soft errors by focusing on the solder composition itself, it is known that soft errors may be reduced by using error correction code. Error correction code reduces soft errors by providing a mechanism which both detects and corrects soft errors. Even if a storage capacitor is filled by charge resulting from an alpha particle, the error correction code will detect the error and return the device it to its original (and correct) empty state. Although error correction code has exhibited a degree of usefulness in reducing soft errors, room for improvement remains. In particular, error correction code is costly in that it creates memory redundancies and requires extra logic to implement. Correspondingly, a need exists for reducing soft errors without having to sacrifice memory or having to implement extra logic circuitry onto a semiconductor chip.

In view of at least the foregoing, it is apparent that an economical, improved solder bump which produces reliable, efficient interconnects while reducing or eliminating soft errors caused by alpha particle emissions is desired.

SUMMARY OF THE INVENTION

Accordingly, an improved solder bump composition and method advantageously employs a thin low-alpha layer of lead (Pb) deposited in close proximity to alpha particle sensitive devices, while ordinary (i.e., low cost) Pb is used for the bulk of the solder bump. This approach allows for reduced overall cost while still providing protection from alpha-particle induced soft errors. The low-alpha layer reduces the flux of alpha particle into devices in two ways. First, the low-alpha layer is itself essentially $Pb^{210}$ free and therefore alpha particle emissions from the low-alpha layer are negligible. Second, the low-alpha layer is substantially opaque to alpha particles emitted by the ordinary Pb that includes $Pb^{210}$. As a result, sensitive circuits on a semiconductor chip employing the improved solder bump are shielded from alpha particle emissions of the low-cost $Pb^{210}$-containing portion of a solder bump.

In one embodiment in accordance with the present invention, a solder bump formed on an integrated circuit chip having an alpha particle (α-particle) sensitive device or circuit defined thereon includes a first portion and a low-alpha lead layer. The first portion includes at least one α-particle emissive constituent. The low-alpha lead layer is formed in contact with the integrated circuit chip and is positioned between the first portion and the α-particle sensitive device or circuit.

In some variations, the first portion includes a lead containing solder and an α-particle emissive constituent is $Pb^{210}$. In some variations, the low-alpha lead layer is substantially free (relative to the first portion) of α-particle emissive constituents and radioactive decay precursors thereof. In some variations, the low-alpha lead exhibits an α-particle emissive characteristic approximately 100 to approximately 1000 times smaller than that of the first portion. In some variations, the low-alpha lead exhibits an α-particle emissive characteristic of less than about 0.1–0.001 α-particles per $cm^2$ per hour. In some variations, the first portion includes SnPb or InPb solder. In some variations, the low-alpha lead layer includes an additional constituent to raise the melting point thereof to above the reflow temperature for the first portion. In some variations, the reflow temperature of a SnPb or InPb solder is at least approximately 25° C. below the melting point of even undoped low-alpha lead.

In another embodiment in accordance with the present invention, a method for reducing α-particle radiation incident on an α-particle sensitive device or circuit of an integrated circuit chip from a lead-containing solder bump includes forming a low-alpha lead layer on the integrated circuit chip and forming lead-containing solder thereon to define solder bump precursors. The solder bump precursors have the low-alpha lead layer disposed between the lead-containing solder and the α-particle sensitive devices or circuits. The method further includes reflowing the solder bump precursors under conditions selected to reflow the lead-containing solder substantially without mixing of the lead containing solder into the low-alpha lead layer.

In some variations, the reflowing is performed at a temperature below the melting point of the low-alpha lead layer but above the reflow temperature of the lead-containing solder. In some variations, the forming of the low-alpha lead layer includes doping low-alpha lead with a constituent selected to raise the melting point of the low-alpha lead layer to at least approximately 25° C. above the reflow temperature of the lead-containing solder. In some variations, the forming of the low-alpha lead layer includes forming multiple sublayers thereof. Boundaries between the sublayers substantially limit intrusion of the lead-containing solder into the low-alpha lead layer during the reflowing.

In yet another embodiment in accordance with the present invention, an apparatus includes an integrated circuit chip having an α-particle sensitive device defined thereon and including a lead-based solder bump for connecting to the integrated circuit chip. The lead-based solder bump includes a low-alpha lead layer formed on a surface of the integrated circuit chip and a lead-containing solder portion formed on the low-alpha lead layer. The low-alpha lead layer is substantially free of α-particle emissive constituents and substantially opaque to α-particle emissions from the lead-containing solder portion.

In some variations, the apparatus further includes a substrate package, a chip carrier, or a printed circuit board, the lead-based solder bump electrically connecting the integrated circuit chip thereto. In some variations, the lead-based solder bump is formed directly over the α-particle sensitive device. In some variations, the α-particle sensitive device is associated with an SRAM memory cell or a DRAM memory cell. In some variations, the integrated circuit chip includes a microprocessor, a memory, and/or a cache.

BRIEF DESCRIPTION OF THE DRAWINGS

The present invention may be better understood, and its numerous objects, features, and advantages made apparent to those skilled in the art by referencing the accompanying drawings.

FIGS. 3A and 3B are a time series of side views of solder bump formation in accordance with an embodiment of the present invention.

The use of the same reference symbols in different drawings indicates similar or identical items.

DESCRIPTION OF THE PREFERRED EMBODIMENT(S)

Figure 1A:
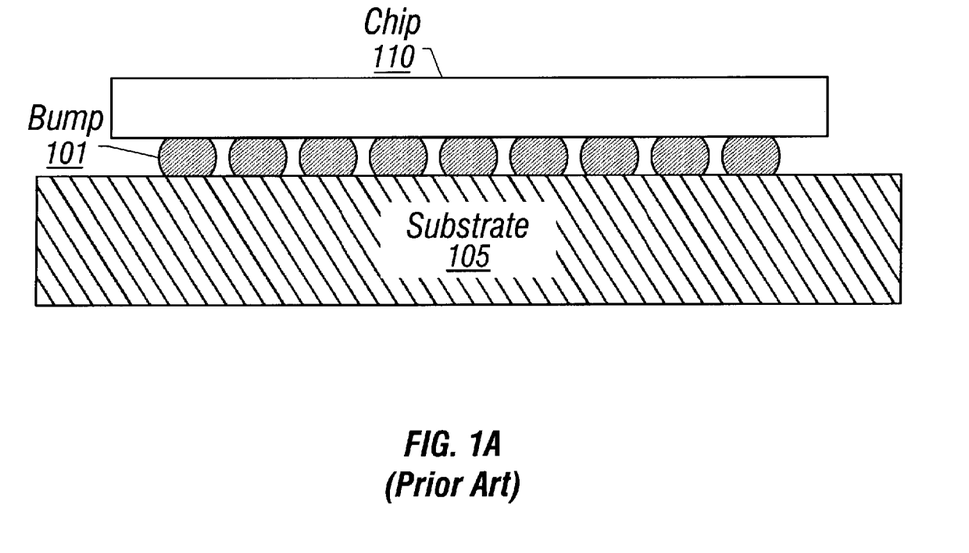
FIG. 1A is a side view of a flip-chip packaging configuration with solder bump interconnections and FIG. 1B is an above perspective view of such a configuration prior to interconnection.
Figure 1B:
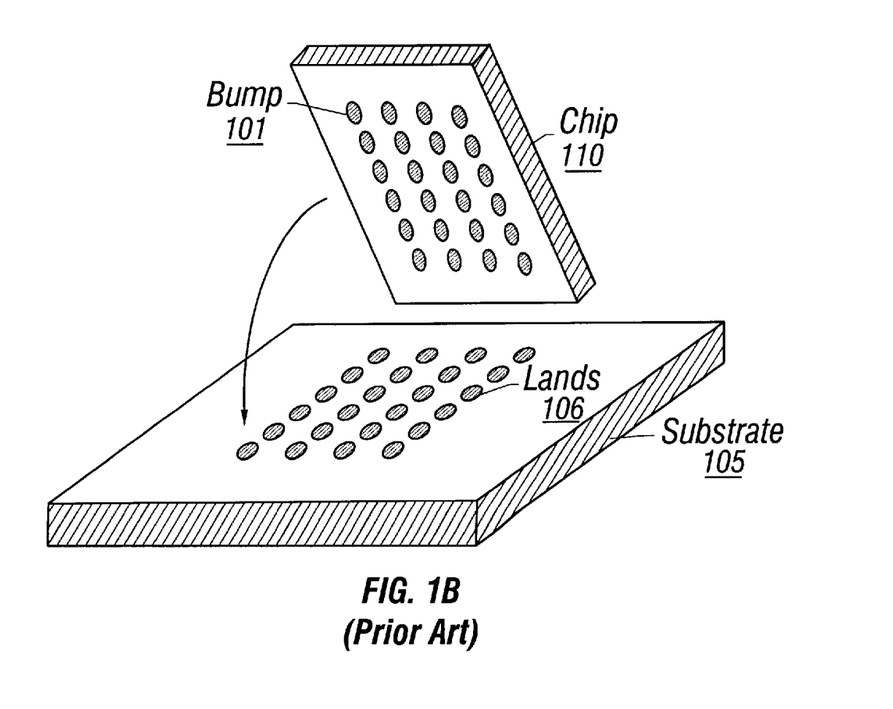

FIGS. 1A and 1B depict a flip chip interconnection of chip 110 to substrate 105 using solder bumps 101. Solder bumps 101 are formed on chip 110, then positioned and reflowed to form mechanical and electrical connections with matching wettable substrate lands 106 on substrate 105. In this way electrical connections can be provided for circuits on chip 110 to the outside world. Flip chip technology was developed during the 1960's by IBM and the current state of the art for flip chip and related chip scale semiconductor packaging technologies is described in a joint industry standard document, J-STD-012 entitled "Implementation of Flip Chip and Chip Scale Technology" and dated Jan. 19, 1996. Those of skill in the art will appreciate the techniques, materials, compositions, and methods of fabrication for such interconnect technology as described in the joint industry standard. J-STD-012 (January 1996) is incorporated herein by reference in its entirety.

Figure 2A:
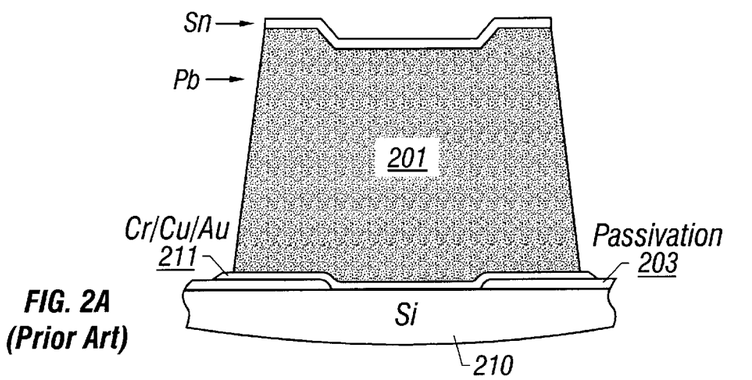
FIGS. 2A, 2B, and 2C are a time series of side views of a solder bump after forming of a precursor Pb/Sn bump, after reflow to form a PbSn solder bump, and after attachment to a packaging substrate.
Figure 2B:
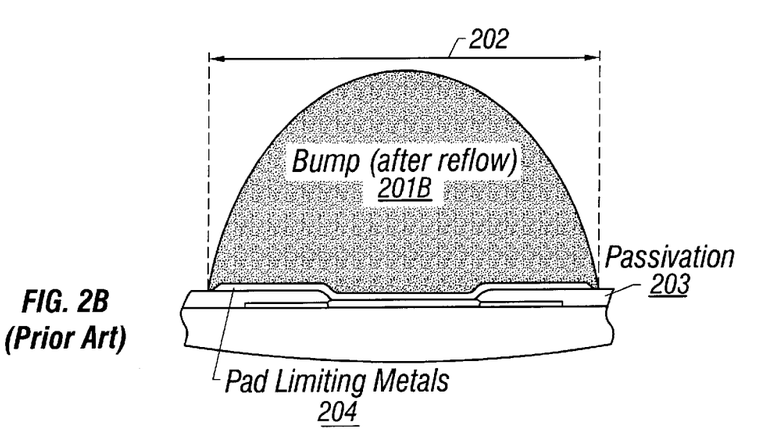
Figure 2C:
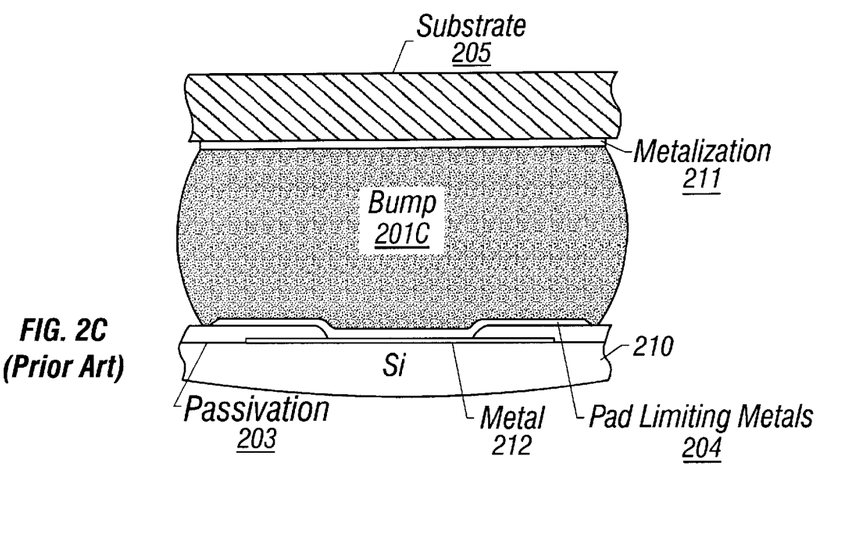

FIGS. 2A, 2B, and 2C depict solder bumps such as bump 101 (FIGS. 1A, 1B) at various stages of an interconnect and packaging process. In particular, FIG. 2A depicts a solder bump precursor 201 which includes a body of lead (Pb) and a cap layer of tin (Sn). The bump precursor 201 is formed on a silicon substrate 210 having a passivation layer 203 and a metal layer 211. In the embodiment of FIG. 2A, the metal layer includes chromium, copper, and gold. In general, such a metal layer 211 establishes a pad limiting metal area and is of a solder wettable terminal metallurgy that defines the size and area of a soldered connection, limits the flow of the solder bump, and provides adhesion and contact to chip wiring. Suitable pad limiting metal configurations are known in the art, See, for example, J-STD-012 at page 20. The solder bump precursor (201) may be formed by any suitable process including, e.g., evaporation, electrodeposition, electroplating, screen printing, etc.

Although FIG. 2A depicts a solder bump precursor for formation of a PbSn solder bump, other solder bump compositions are possible with corresponding modifications to the precursor. Common solder bump compositions include 90 PbSn, 97 PbSn, 63 SnPb, 50 InPb, and 95 PbSn. Whatever the constituents of the solder bump precursor and method of formation, a subsequent non-oxidizing reflow process yields a rounded solder bump. For example, solder bump precursor 201 is heated such that the lead and tin components thereof melt to form solder bump 201B (FIG. 2B).

Substrate 205, which includes metallization bonding pad 211, is then heated to reflow solder bump 201B and substrate 205 is placed to bond corresponding metallization pads 211 to metal features 212 of silicon substrate 210. The resulting solder bump 201C forms the electrical and mechanical bridge between the chip and the next level assembly, in this case, substrate 205.

Although not shown in FIGS. 2A, 2B, and 2C, a variety of techniques can be used to ensure that solder bumps such as solder bump 201c form connections between corresponding metal pads of the substrate and skip to the substrate 205 and the chip 210 without collapse of the solder bump. One of these is the controlled collapse chip connection (C4) method in which a solder joint collecting a flip chip in which the solder bump connects the flip chip and substrate where the chip connection surface tension forces of the liquid solder supports the weight of the chip and controls the collapse height of the joint. Alternative or complementary techniques include the use of mechanical standoffs such as a copper ball standoff in the solder joint or a glass dam.

As described above, lead in solder bump material (e.g., 201, 201B, and 201C), can often contain alpha particle emitters. For example, low cost lead often contains traces of thorium and various decay products such as polonium as well as the radiogenic isotope, $Pb^{201}$. FIGS. 3A and 3B, FIGS. 6A and 6B, and FIGS. 4A and 4B depict various improved solder bump configurations in which a low-alpha lead layer 310 is used in close proximity to chip 330 that may include circuits sensitive to alpha particle emissions. Each of the exemplary configurations is now described.

Figure 3A:
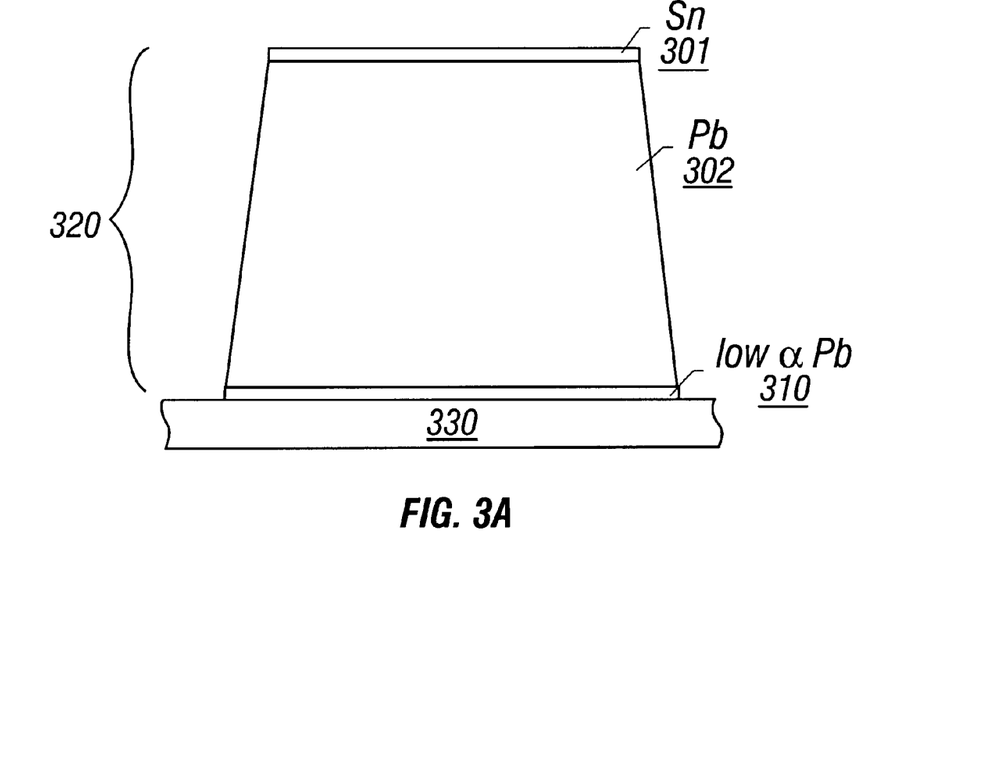
FIG. 3A depicts a low-alpha lead (low α Pb) layer positioned to shield α-particle sensitive devices and/or circuits of a semiconductor chip from α-particles from normal (α emitter bearing) lead.
Figure 3B:
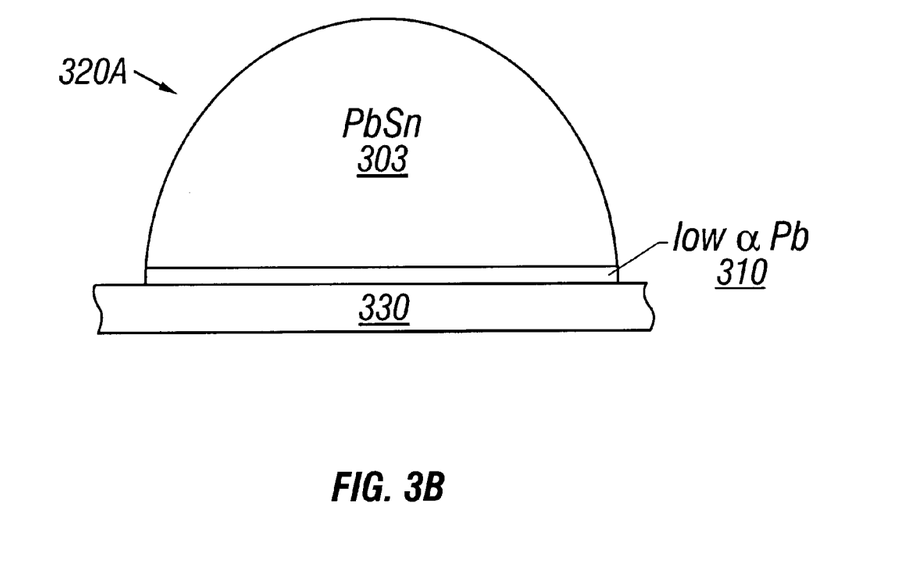
FIG. 3B depicts a resultant PbSn solder bump after reflow wherein the low α lead layer thereof remains substantially intact in accordance with various embodiments of the present invention.

In a first exemplary configuration, a low-alpha lead layer 310 is employed. As shown in FIG. 3A, the low-alpha lead layer 310 is formed on the surface of chip 330 and lead 302 (e.g., low cost lead that may contain alpha particle emitters) is formed thereupon. As before, a cap layer of tin 301 is formed on top of the lead. In this way, a solder bump precursor 320 is provided. Solder bump precursor 320 is heated above the melting points of lead 302 and tin 301 to reflow the metals such that the two alloy to form solder bump 303 as shown in FIG. 3B. Note that although tin 301 and lead 302 alloy to form solder bump 303, low-alpha lead layer 310 remains substantially unmixed with the resultant solder bump 303. As a result, low-alpha lead layer 310 forms an α-particle barrier between the solder bump which includes alpha emitters and sensitive circuits of chip 330. Several techniques for maintaining low-alpha lead layer 310 substantially unmixed with the resultant solder bump 303 are described in greater detail below.

As noted in J-STD-012 (January 1996) at 22–23, 26 soft errors in circuits and devices, e.g., memory cells of DRAM and SRAM chips, are a substantial problem. In fact, the joint standard document states that solder must be kept in an appropriate distance from such alpha particle sensitive circuitry. For example, a separation of 150 μm is required between (4 bumps (97 PbSn)) and sensitive circuitry on polyimide passivated devices. Although measures such as thicker passivations or metal shields can mitigate the effects of proximity, the use of a low-alpha lead layer in accordance with the present invention has a manufacturing advantage since change in current process technology is required. Using a low-alpha lead layer as described herein, typical solder bumps containing normal lead (e.g., low-cost alpha emitter bearing lead) can be formed directly on typical SRAM or DRAM cells fabricated in 0.35 μm (or smaller) process.

In general, lead will be considered to be low-alpha lead based on a relative measure of α-particle emissivity as compared to bulk, low-cost lead and based on the sensitivity of a particular device technology to α-particle upsets. In other words, "low" is relative to emissive characteristics of low-cost bulk lead suitable for C4 or other solder bump processes and relative to device requirements. An optimal "lowness" for α-particle emissivity is a function of cost and sensitivity of a particular device technology to α-particle upsets. For example, given a particular level of device sensitivity, an extremely low emissivity low-alpha lead (e.g., less than 0.001 α-particles per $cm^2$ per hour) may be desireable. However, in other situations, a low-alpha lead with an α-particle emissivity of less than 0.1 α-particles per $cm^2$ per hour may be suitable. Because a low-alpha lead layer also acts as a barrier to α-particles from ordinary lead-bearing solder, thickness of the low alpha lead layer is also a factor. Depending on market cost, a thinner low-alpha lead layer of extremely low emissivity lead may be preferable to a thicker low-alpha lead layer of moderately low emissivity lead, or vice versa.

Appropriate α-particle emissivity characteristics and layer thicknesses will vary for differing device technologies, levels of integration, proximities to α-particle sensitive devices, emissivites of bulk, low-cost lead, and lead market conditions. However, for 0.35 μm technology used in microprocessor fabrication with solder bumps directly over cache memory cells, low-alpha lead layers of less than 1 μm exhibiting emissivities of less than approximately 0.05 α-particles per $cm^2$ per hour are suitable.

To maintain low-alpha lead layer 310 substantially unmixed with the normal lead of solder bump 303, several techniques are suitable. For example, low-alpha lead of layer 310 can be formed with additional constituents so as to raise the melting point of low-alpha lead layer 310 to above the temperature required to melt tin 301 and lead 302. In this way, low-alpha lead layer 310 remains in solid form even as solder bump 303 is formed. Such additional constituent materials need only raise the melting point by approximately 30°. Suitable additional constituent elements include:

Au (@1–10% by weight);
Ba (@1–10% by weight);
Ca (@1–10% by weight);
Cu (@1–10% by weight);
Mg (@1–10% by weight);

Hg (@1–10% by weight); and

Rare earth elements (@1–5% by weight), as well as combinations thereof. Of these, constituent element concentrations of Hg (@4–5% by weight), Mg (@2–3% by weight) and Au (@3–4% by weight) are generally preferred. Constituent element selections resulting in greater or lesser raising of melting point for low-alpha lead layer 310 may be employed depending on the precision of temperature control available in a particular manufacturing process.

Figure 6A:
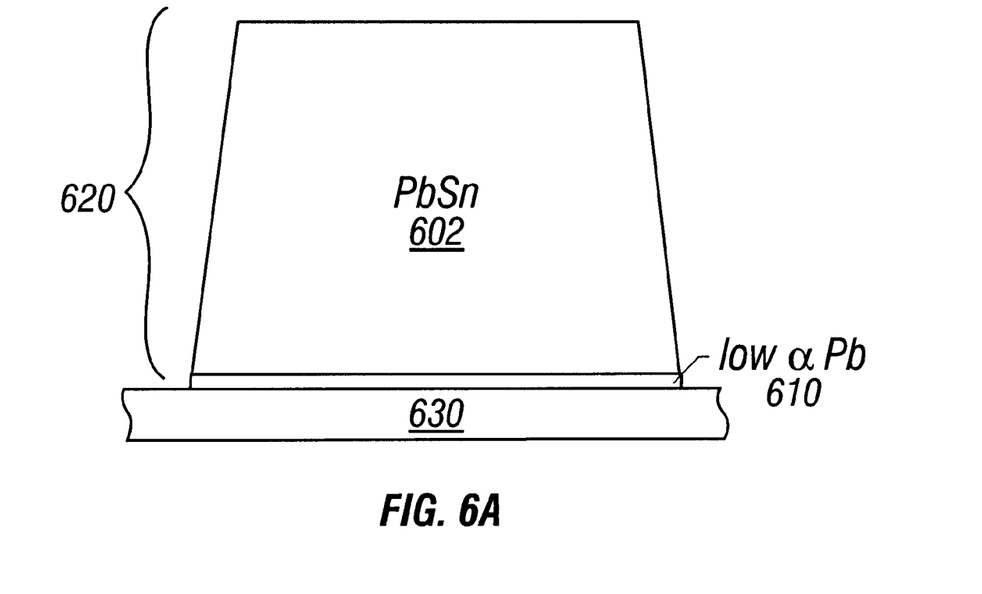
FIG. 6A depicts a low-α lead layer positioned to shield α-particle sensitive devices and/or circuits of a semiconductor chip from α-particles from a solder alloy of α emitter bearing lead formed thereon.
Figure 6B:
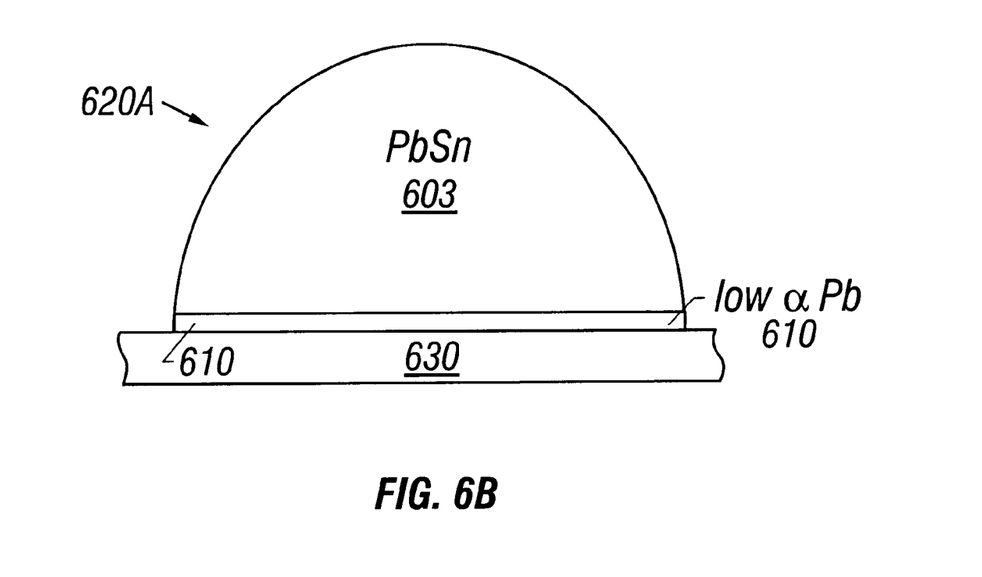
FIG. 6B depicts a resultant solder bump after reflow wherein the low-α lead layer thereof remains substantially intact due to its higher melting point than the solder alloy.

Another technique for ensuring that a low-alpha lead layer remains substantially unmixed with the alpha emitter containing material involves lowering the melting point of the alpha emitter containing material compared to that of the low-alpha lead. FIGS. 6A and 6B depict an exemplary embodiment in which a PbSn solder alloy 602 is formed on low-alpha lead layer 610. In particular, a low-alpha lead layer 610 is deposited by evaporation (or other method such as electroplating) to a thickness of approximately 1 μm. The remainder of solder bump precursor 620 is deposited at a desired Pb/Sn ratio. For example, in an evaporative process, a sequence of boats containing metal targets can be used where the first boat (or boats) contain(s) low-alpha lead and the remainder contain the desired PbSn mixture. When the evaporation cycle is complete, (i.e., after one complete pass), a layer approximately 1 μm thick of low-alpha lead is formed beneath the PbSn alloy.

The fractional percentage of Sn is selected to lower the melting point of the PbSn alloy below that of the low-alpha lead. For example, a 10% Sn fraction lowers the melting point of the PbSn allow to approximately 300° C. as compared with 327° C. for low-alpha lead layer 610. In this way, a convenient reflow temperature can be selected to ensure that low-alpha lead layer 610 does not melt and remains substantially unmixed with the PbSn alloy containing α-particle emitters. Therefore, the integrity of low-alpha lead layer 610 is maintained while PbSn solder alloy 602 is reflowed, providing an α-particle shield to sensitive devices on chip 630 (e.g., SRAM or DRAM cells).

A similar configuration and process is envisioned for PbIn alloys where substantially pure low-alpha lead deposited as an initial layer to a thickness of approximately 1 μm and a PbIn bump is deposited thereupon. The fraction of In is chosen so that the melting point of the PbIn mixture is lower than that of the low-alpha lead. As before, this technique provides an undisturbed layer of low-alpha lead to act as a shield to α-particles emitted by constituents of the low-cost lead included in the PbIn mixture.

Figure 4A:
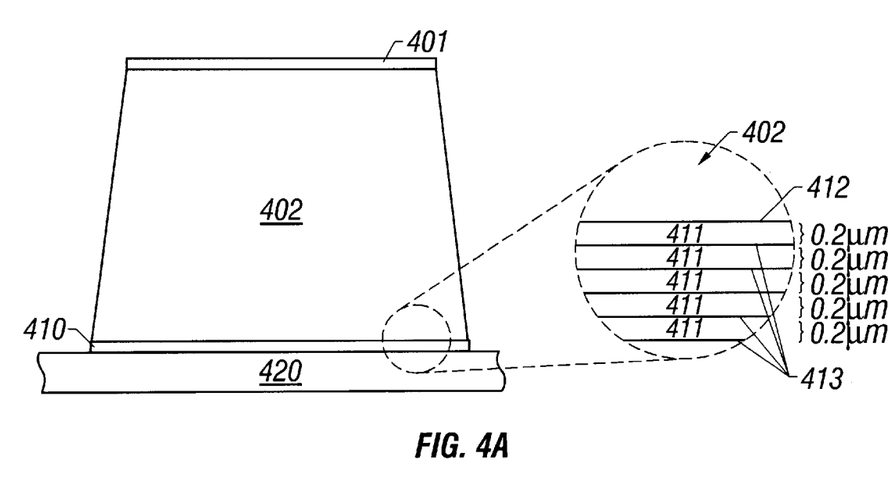
FIGS. 4A and 4B depict an embodiment of a solder bump wherein the low-α lead layer is formed of multiple sublayers thereof such that the boundaries between the sublayers contribute to the prevention of mixing of normal (α emitter bearing) lead into the low α lead layer.
Figure 4B:
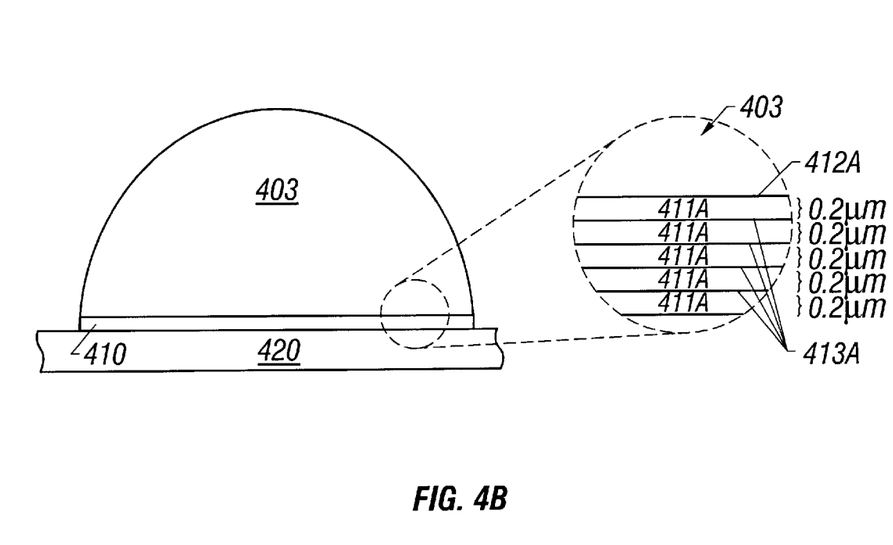

Another technique for ensuring that low-alpha lead layer 310 remains substantially unmixed with α-particle emitter bearing lead, even as solder bump 303 is formed, is shown in FIGS. 4A and 4B. Multiple successive component layers of the low-alpha lead layer 310 are formed. In the illustrative embodiment of FIGS. 4A and 4B, five 0.2 μm layers of low-alpha lead 411 are formed by successive layer forming process steps, e.g., evaporation, sputtering electrodeposition, electroplating, screen printing, etc. In this way, the aggregate low-alpha lead layer 410 includes a boundary layer 412 between the top layer of low-alpha lead and the overlayer of normal lead 402 as well as multiple interior boundaries between low-alpha lead layers 410. These boundaries between layers advantageously limit the mixing of bearing lead 402 with at least the lower portion of low-alpha lead layer 410, even when reflow temperatures are sufficient to melt lead 402, tin 401, and low-alpha lead 410. Mixing is prevented by the presence of the interlayer boundaries (e.g., 412 and 413) which act as gettering sites thereby preventing the uniform flow of heat.

FIG. 4B shows the resultant solder bump 403 after reflow. Note that the individual layers of low-alpha lead 410 are preserved. Therefore, after reflow, a solder bump in accordance with the present invention includes a low-alpha layer 410 that is essentially free of alpha particle emitting isotopes and that acts as an α-particle barrier layer to α-particle emissions from solder bump 403 (which contains normal, α-particle emitting, lead). In this way, sensitive circuits such as memory cells are protected from α-particle emissions without requiring large amounts of expensive low-alpha lead, error correcting code techniques, or other material overlayers such as indium or gold.

Referring back to FIGS. 3A and 3B, typical scale for the solder bump precursor is as follows. Lead layer 302 is approximately 60 to 70 μm in thickness, whereas low-alpha lead layer 310 is approximately 1 μm in thickness. Although a variety of relative dimensions are possible, thinner low-alpha lead layers are generally advantageous so as to reduce the amount and expense of low-alpha lead consumed. On the other hand, thicker layers provide more effective barriers to α-particle emissions and greater protection from the transient errors that can result. In practice, a 1 μm layer of low-alpha lead has been found to be effective, although thinner and thicker layers (e.g., layers varying from about 0.5 μm to about 5 μm) may also be suitable. Such low-alpha lead layers can be formed by evaporation, by sputtering, by electroplating, or by any other suitable method.

Figure 5:
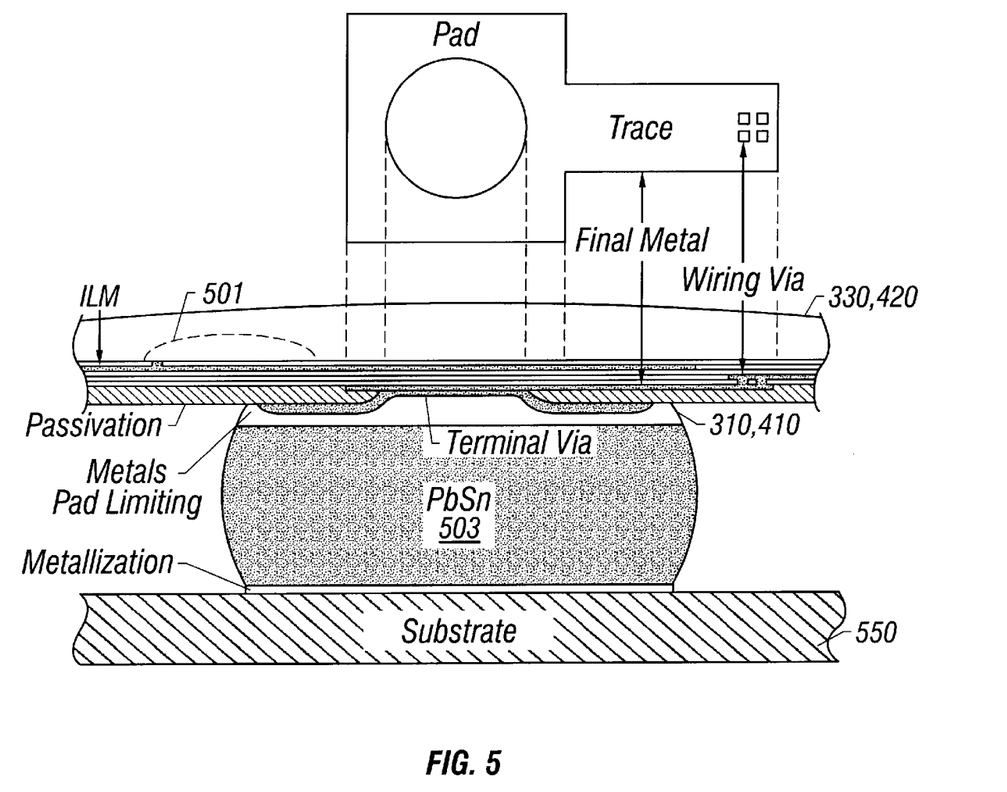
FIG. 5 depicts a chip including α-particle sensitive devices and/or circuits electrically and mechanically connected to a substrate using an improved solder bump configuration and method including a low α lead layer formed and maintained in accordance with an embodiment of the present invention.

FIG. 5 depicts a C4 bump interconnection (solder bump 503) between chip 330, 420 and substrate 550, with a low-alpha lead layer 310, 410 interposed between the α-particle emitter bearing lead of solder bump 503 and a sensitive device region 501 of chip 330, 420. The low-alpha lead layer is formed and maintained by any suitable technique. For example, the low-alpha lead layer may be formed and maintained through reflow as described above with reference to FIGS. 3A and 3B (e.g., by doping the low-alpha lead layer to raise its melting point), as described above with reference to FIGS. 6A and 6B (e.g., by forming a reduced melting point alloy or mixture on the low-alpha lead layer), or as described above with reference to FIGS. 4A and 4B (e.g., by exploiting gettering sites a sublayer boundaries). In any case, mixing of normal alpha emitter bearing lead 302, 602, 402 into the low-alpha lead layer 310, 610, 410 is substantially limited or prevented.

Illustratively, α-particle sensitive device region 501 may include DRAM or SRAM cells, e.g., of a cache memory, for a microprocessor formed on chip 330, 630, 420. In this way, solder bump 503 can be formed in close proximity to sensitive device region 501 without exposing sensitive device region 501 to soft-error inducing, solder bump generated α-particle emissions. As a result, such sensitive device regions and solder bump interconnections can be formed at higher densities and with fewer α-particle emission related positional constraints. It is expected that the advantages of solder bumps formed in accordance with the present invention will increase as feature sizes decrease on chips such as 330, 630, 420. Such decreased feature sizes, for example in sub 0.25 μm advanced microprocessors, increase the vulnerability of devices and circuits, (particularly memory cells of caches) to α-particle induced soft errors. In addition, such higher density circuits increase demands for interconnect density, and hence, for surface area of chip 330, 630, 420 usable for chip scale interconnect formation.

While the invention has been described with reference to various embodiments, it will be understood that these embodiments are illustrative and that the scope of the invention is not limited to them. Many variations, modifications, additions, and improvements of the embodiments described are possible. For example, although solder compositions of lead and tin have been described, other compositions bearing a particle emitters may also benefit from a low α lead layer. For example, an InSb solder embodiment is envisioned. Furthermore, although embodiments have been described (1) in which the melting point for a low-alpha lead portion of a solder bump is elevated with respect to an alpha-emitter bearing lead portion thereof, (2) in which the melting point for the alpha-emitter bearing lead portion is reduced with respect to the low-alpha lead portion of a solder bump thereof, and (3) in which structural aspects of a low-alpha lead layer are employed to limit mixing of the low-alpha lead layer with alpha-emitter bearing lead, other embodiments may combine aspects of the described to achieve similar results. For example, a low-alpha lead layer may be doped to increase its melting temperature while a Pb-based alloy may be formed thereon with alloy constituents selected to reduce the alloy melting temperature. Although embodiments of the present invention have been described primarily in the context of a semiconductor device having α-particle sensitive memory cells, e.g., a DRAM, SRAM or microprocessor including on-chip cache or main memory, other α-particle sensitive microelectronics applications are also suitable. These and other variations, modifications, additions, and improvements may fall within the scope of the invention as defined in the claims which follow.

What is claimed is:

1. A solder bump formed on an integrated circuit chip having an alpha particle (α-particle) sensitive device or circuit defined thereon, said solder bump comprising:
   a first portion including at least one α-particle emissive constituent; and
   a low-alpha layer formed in contact with said integrated circuit chip, said low-alpha layer positioned between said first portion and said α-particle sensitive device or circuit.

2. A solder bump as recited in claim 1, wherein said at least one α-particle emissive constituent includes $Pb^{210}$.

3. A solder bump as recited in claim 1, wherein said low-alpha layer includes low-alpha Pb.

4. A solder bump as recited in claim 1, wherein said low-alpha layer is substantially free of α-particle emissive constituents and radioactive decay precursors thereof relative to said first portion.

5. A solder bump as recited in claim 1, wherein said first portion includes PbSb solder.

6. A solder bump as recited in claim 1, wherein said first portion includes InSb solder.

7. A solder bump as recited in claim 1, wherein said low-alpha layer exhibits an α-particle emissive characteristic approximately 100 to approximately 1000 times smaller than that of said first portion.

8. A solder bump as recited in claim 1, wherein said low-alpha layer exhibits an α-particle emissive characteristic of about 0.1 to about 0.001 α-particles per $cm^2$ per hour.

9. A solder bump as recited in claim 1, wherein said first portion exhibits an α-particle emissive characteristic greater than approximately 1–10 α-particles per $cm^2$ per hour.

10. A solder bump as recited in claim 1,
    wherein said low-alpha layer exhibits a first α-particle emissive characteristic and said first portion exhibits a second α-particle emissive characteristic; and
    wherein thickness of said low-alpha layer is selected in accordance with said first and said second α-particle emissive characteristics, a lower ratio of said first α-particle emissive characteristic to said second α-particle emissive characteristic allowing a thinner thickness of said low-alpha layer.

11. A solder bump as recited in claim 1, wherein said at least one α-particle emissive constituent includes either or both of $Pb^{210}$ and its radioactive decay precursors.

12. A solder bump as recited in claim 1,
    wherein said low-alpha layer is substantially free of α-particle emissive isotopes; and
    substantially opaque to α-particle emissions of said first portion such that solder bump related α-particle induced soft errors in said α-particle sensitive device or circuit are substantially eliminated.

13. A solder bump as recited in claim 1,
    wherein said low-alpha layer includes an additional constituent to raise the melting point of said low-alpha layer to above a reflow temperature for said first portion.

14. A solder bump as recited in claim 13, wherein said additional constituent includes an element selected from the group of Au, Ba, Ca, Cu, Mg, Hg, and a rare earth element.

15. A solder bump as recited in claim 13, wherein said additional constituent is introduced into said low-alpha layer at sufficient concentration to raise the melting point thereof to at least approximately 25 degrees above said reflow temperature for said first portion.

16. A solder bump as recited in claim 13, wherein said additional constituent includes an element selected from the group of Au at concentration of approximately 3% to approximately 4% by weight, Mg at concentration of approximately 2% to approximately 3% by weight, and Hg at concentration of approximately 4% to approximately 5% by weight.

17. A solder bump as recited in claim 13, wherein said first portion includes a Pb-containing solder having a reflow temperature lower than a melting point of said low-alpha layer.

18. A solder bump as recited in claim 13,
    wherein said first portion includes one of a SnPb solder and an InPb solder; and
    wherein said low-alpha layer has a melting point at least approximately 25° C. above a reflow temperature for said first portion.

19. A solder bump as recited in claim 1,
    wherein said first portion includes a Pb-containing solder; and
    wherein said low-alpha layer includes plural separately formed sublayers thereof, boundaries between said sublayers substantially inhibiting intrusion of said α-particle emissive radioisotope from said Pb-containing solder into said low-alpha layer during reflow.

20. A solder bump as recited in claim 1, wherein said low-alpha layer is formed in electrical contact with an electrically conductive portion of said integrated circuit chip.

21. The solder bump as recited in claim 1, reflowed to form an electrical and mechanical connection to a substrate in a packaged integrated circuit.

22. The solder bump as recited in claim 21,
    wherein said packaged integrated circuit includes a microprocessor with an on-chip cache; and
    wherein said α-particle sensitive device or circuit includes a memory cell of said an on-chip cache.

23. A solder bump as recited in claim 1, wherein said α-particle sensitive device or circuit includes one of an SRAM memory cell and a DRAM memory cell.

24. A solder bump as recited in claim 1, wherein said low-alpha layer is at least approximately 0.5 μm in thickness.

25. A solder bump as recited in claim 1, wherein said low-alpha layer is at least approximately 1.0 μm in thickness.

26. A solder bump as recited in claim 19, wherein said plural separately formed sublayers of said low-alpha layer total at least approximately 1.0 μm in thickness.

27. A solder bump as recited in claim 19, wherein said plural separately formed sublayers of said low-alpha layer are each approximately 0.2 μm in thickness.

28. A solder bump as recited in claim 19, wherein at least one of said plural separately formed sublayers of said low-alpha layer includes an additional constituent to raise the melting point of said sublayer to above a reflow temperature for said Pb-containing solder.

29. A solder bump as recited in claim 1, wherein said low-alpha layer exhibits an α-particle emissive characteristic more than about 50 times smaller than that of said first portion.

30. A solder bump as recited in claim 1, wherein said low-alpha layer exhibits an α-particle emissive characteristic of less than about 0.5 α-particles per $cm^2$ per hour.

31. A solder bump as recited in claim 1, wherein said low-alpha layer exhibits an α-particle emissive characteristic of less than about 0.1–0.001 α-particles per $cm^2$ per hour.

32. A method for reducing α-particle radiation incident on an α-particle sensitive device or circuit of an integrated circuit chip from a solder bump, said method comprising:

forming a low-alpha layer on said integrated circuit chip; and forming an α-particle emissive solder thereon to define a solder bump precursor having said low-alpha layer disposed between said α-particle emissive solder and said α-particle sensitive devices or circuits.

33. A method as recited in claim 32, further comprising:

reflowing said solder bump precursor under conditions selected to reflow said α-particle emissive solder substantially without mixing of said α-particle emissive solder into said low-alpha layer.

34. A method as recited in claim 32, wherein said low-alpha layer includes low-alpha Pb; and wherein said α-particle emissive solder includes $Pb^{210}$.

35. A method as recited in claim 33, wherein said reflowing is performed at a temperature below the melting point of said low-alpha layer but above a reflow temperature of said αparticle emissive solder.

36. A method as recited in claim 32, wherein said forming said low-alpha layer includes doping low-alpha Pb with a constituent selected to raise the melting point of said low-alpha Pb to at least approximately 25° C. above a reflow temperature of said α-particle emissive solder.

37. A method as recited in claim 32, wherein said forming said low-alpha layer includes forming plural sublayers thereof; and wherein boundaries between said sublayers substantially limit intrusion of said α-particle emissive solder into said low-alpha layer during reflow.

38. A method as recited in claim 32, wherein said forming said low-alpha layer is by one or more of evaporation, sputtering, and electroplating.

39. A solder bump precursor comprising:

a first Pb-based conductive layer formed on a semiconductor chip having a radiation sensitive device defined in closed proximity to said solder bump precursor, said first Pb-based conductive layer being substantially free of radioactive isotopes and being substantially opaque to radiation; and a second Pb-based conductive layer formed on the first Pb-based conductive layer, wherein compositions of said first and said second Pb-based conductive layers are selected to allow reflow of said solder bump precursor at a reflow temperature below a melting point of said first Pb-based conductive layer.

40. A solder bump precursor as in claim 39, wherein said first Pb-based conductive layer is substantially free from $Pb^{210}$ and the second Pb-based conductive layer includes $Pb^{210}$.

41. A solder bump precursor as in claim 39, wherein said radiation includes α-particle radiation.

42. A solder bump precursor as in claim 39, wherein said melting point of the first Pb-based conductive layer is approximately 30° C. higher than said reflow temperature.

* * * * *